(12) United States Patent
Park et al.

(10) Patent No.: US 9,842,696 B2
(45) Date of Patent: Dec. 12, 2017

(54) COMPOSITE PEROVSKITE POWDER, PREPARATION METHOD THEREOF, AND PASTE COMPOSITION FOR INTERNAL ELECTRODE HAVING THE SAME

(71) Applicant: SAMSUNG ELECTRO-MECHANICS CO., LTD., Suwon, Gyunggi-do (KR)

(72) Inventors: Kum Jin Park, Gyunggi-do (KR); Chang Hak Choi, Gyunggi-do (KR); Sang Min Youn, Gyunggi-do (KR); Kwang Hee Nam, Gyunggi-do (KR); Ki Myoung Yun, Gyunggi-do (KR); Hyung Joon Jeon, Gyunggi-do (KR); Jong Hoon Yoo, Gyunggi-do (KR)

(73) Assignee: SAMSUNG ELECTRO-MECHANICS CO., LTD., Suwon-si, Gyeonggi-do (KR)

(*) Notice: Subject to any disclaimer, the term of this patent is extended or adjusted under 35 U.S.C. 154(b) by 189 days.

(21) Appl. No.: 14/153,924

(22) Filed: Jan. 13, 2014

(65) Prior Publication Data
US 2015/0083978 A1 Mar. 26, 2015

(30) Foreign Application Priority Data
Sep. 23, 2013 (KR) .......................... 10-2013-0112416

(51) Int. Cl.
*H01B 1/08* (2006.01)
*H01G 4/12* (2006.01)
(Continued)

(52) U.S. Cl.
CPC ....... *H01G 4/1227* (2013.01); *C04B 35/4682* (2013.01); *C04B 35/49* (2013.01);
(Continued)

(58) Field of Classification Search
CPC ...... H01G 4/1227; H01G 4/0085; H01G 4/30; C04B 35/4682; C04B 35/49;
(Continued)

(56) References Cited

U.S. PATENT DOCUMENTS

| 2004/0248724 A1* | 12/2004 | Venigalla | B82Y 30/00 501/137 |
| 2009/0059471 A1* | 3/2009 | Fukuda | H01G 4/1227 361/321.4 |
| 2012/0141790 A1* | 6/2012 | Kim | B82Y 30/00 428/402 |

FOREIGN PATENT DOCUMENTS

| JP | 2007001840 A * | 1/2007 |
| JP | 2010-215427 A | 9/2010 |

(Continued)

*Primary Examiner* — Harold Pyon
*Assistant Examiner* — Danny N Kang
(74) *Attorney, Agent, or Firm* — McDermott Will & Emery LLP (57) ABSTRACT

There are provided a composite perovskite powder, a preparation method thereof, and a paste composition for an internal electrode having the same, the composite perovskite powder capable of preventing ions from being eluted from an aqueous system at the time of synthesis while being ultra-atomized, such that when the composite perovskite powder is used as an inhibitor powder for an internal electrode, sintering properties of the internal electrode may be deteriorated, and sintering properties of a dielectric material may be increased; accordingly, connectivity of the internal electrode may be improved, and permittivity and reliability of a multilayer ceramic capacitor (MLCC) may be increased.

5 Claims, 4 Drawing Sheets

(51) Int. Cl.
  *H01B 3/12*    (2006.01)
  *C04B 35/468*  (2006.01)
  *C04B 35/49*   (2006.01)
  *C04B 35/626*  (2006.01)
  *C04B 35/628*  (2006.01)
  *C04B 35/632*  (2006.01)
  *H01G 4/008*   (2006.01)
  *H01G 4/30*    (2006.01)
  *H01L 41/297*  (2013.01)

(52) U.S. Cl.
  CPC ...... *C04B 35/6268* (2013.01); *C04B 35/6281* (2013.01); *C04B 35/632* (2013.01); *H01B 3/12* (2013.01); *H01G 4/0085* (2013.01); *H01G 4/30* (2013.01); *C04B 2235/3224* (2013.01); *C04B 2235/3225* (2013.01); *C04B 2235/3236* (2013.01); *C04B 2235/441* (2013.01); *C04B 2235/442* (2013.01); *C04B 2235/5409* (2013.01); *C04B 2235/5454* (2013.01); *H01L 41/297* (2013.01)

(58) Field of Classification Search
  CPC ............ C04B 35/6268; C04B 35/6281; C04B 35/632; C04B 2235/3224; C04B 2235/3225; C04B 2235/3236; C04B 2235/442; C04B 2235/5409; C04B 2235/5454; H01B 3/12; H01L 41/297
  USPC ....................................................... 252/500
  See application file for complete search history.

(56) References Cited

FOREIGN PATENT DOCUMENTS

| | | | |
|---|---|---|---|
| JP | KR 20100103388 A | * | 9/2010 |
| KR | 10-2012-0042599 A | | 5/2012 |

\* cited by examiner

COMPOSITE PEROVSKITE POWDER, PREPARATION METHOD THEREOF, AND PASTE COMPOSITION FOR INTERNAL ELECTRODE HAVING THE SAME

CROSS-REFERENCE TO RELATED APPLICATION

This application claims the benefit of Korean Patent Application No. 10-2013-0112416 filed on Sep. 23, 2013, with the Korean Intellectual Property Office, the disclosure of which is incorporated herein by reference.

BACKGROUND

The present disclosure relates to a composite perovskite powder, a preparation method thereof, and a paste composition for an internal electrode having the same, and more particularly, to an ultra-fine composite perovskite powder used in a multilayer ceramic capacitor (MLCC), or the like, a preparation method thereof, and a paste composition for an internal electrode.

A barium titanate-based perovskite powder, or the like, a ferroelectric ceramic material, is used as a dielectric material in an electronic component such as a multilayer ceramic capacitor (MLCC), a ceramic filter, a piezoelectric element, a ferroelectric memory (FeRAM), a thermistor, a varistor, or the like.

In accordance with the current trend toward slimness and lightness, high capacitance, high reliability, and the like, in the area of electronic components, atomization of a barium titanate-based perovskite powder used as the ferroelectric material in multilayer ceramic capacitors (MLCC) has been required.

As preparation methods of such a barium titanate-based perovskite powder, there are provided a solid state reaction method and a wet method, but in the case of the solid state reaction method, since a crystalline phase is formed by high temperature calcination, there are disadvantages in that a high temperature calcination process and a grinding process are required, a shape of the synthesized particle may not be optimal, and particle size distribution may be relatively wide. In addition, it may be difficult to disperse the particles, due to lumping caused by heat treatment, and generally, a minimal particle size is significantly large (about 1 µm).

In the case of hydrothermally synthesizing the barium titanate-based perovskite powder using the wet method without heat treatment, the dispersion problem may be solved, and in hydrothermal synthesis, it is easy to control the shape of particles, in addition to particles having a small size and narrow particle size distribution being able to be synthesized.

Meanwhile, a dielectric layer and an internal electrode layer are present in the multilayer ceramic capacitor (MLCC), but there may be a problem, in that since an internal electrode may be sintered faster than the dielectric layer, as the MLCC is reduced in thickness, connectivity of the internal electrode may be further deteriorated. In order to solve this problem, at the time of preparing a paste for an internal electrode, a dielectric powder is mixed and used. Powder used for this purpose is referred to as an inhibitor.

The dielectric inhibitor powder in the paste for an internal electrode initially delays the sintering of the internal electrode and is discharged into the dielectric layer when the sintering of the internal electrode is completed. Since the inhibitor is formed of the same component as that of the dielectric layer, the inhibitor discharged into the dielectric layer may serve as a dielectric material after sintering.

However, although the inhibitor powder for an internal electrode is added, since there is still a significant difference in a sintering rate between the internal electrode and the dielectric layer, in the case in which the MLCC is thick, there is no problem, but as the MLCC is reduced in thickness, the connectivity of the internal electrode may be deteriorated.

In addition, as the MLCC is reduced in thickness, the inhibitor powder for an internal electrode should be further atomized, but in the case of ultra-fine particles, there are problems in that ions of barium, or the like, may be eluted into an aqueous system due to a large specific surface area, a composition ratio may be deviated, and aggregation of the particles may be severe.

A process of hydrothermally synthesizing fine barium titanate without heat treatment has been disclosed in the following Patent Document 1, but there is a limitation in preparing ultra-fine particles required for the inhibitor powder for an internal electrode of a miniaturized and thin multilayer ceramic capacitor (MLCC), and ions may be eluted into an aqueous system at the time of synthesis.

RELATED ART DOCUMENT (Patent Document 1) Korean Patent Laid-open Publication No. 2012-0042599

SUMMARY

An aspect of the present disclosure may provide a composite perovskite powder preventing ions from being eluted from an aqueous system while enabling synthesis of ultra-fine dielectric powder, and a preparation method thereof.

An aspect of the present disclosure may also provide a paste composition for an internal electrode having a composite perovskite powder capable of improving connectivity of an internal electrode by decreasing sintering properties of the internal electrode and increasing sintering properties of a dielectric material and capable of increasing permittivity and reliability of a multilayer ceramic capacitor (MLCC) as an inhibitor powder.

According to an aspect of the present disclosure, in a composite perovskite powder having an $ABO_3$ structure, the composite perovskite powder may include a barium carbonate ($BaCO_3$) coating layer formed on a surface thereof.

The A site may be at least one selected from a group consisting of Ba, $Ba_xY_{1-x}$, $Ba_xDy_{1-x}$, and $Ba_xHo_{1-x}$.

The B site may be at least one selected from a group consisting of Ti, $Ti_xZr_{1-x}$, and $Ti_xSi_{1-x}$.

The composite perovskite powder may have an average particle size of 1 to 10 nm.

The composite perovskite powder may have a BET specific surface area of 50 to 400 $m^2/g$.

The barium carbonate ($BaCO_3$) coating layer may have a thickness of 0.1 to 5 nm.

A molar ratio of barium carbonate ($BaCO_3$) to $ABO_3$ in the composite perovskite powder may be 0.01 to 0.5.

According to another aspect of the present disclosure, a paste composition for an internal electrode may include the composite perovskite powder as described above.

According to another aspect of the present disclosure, a preparation method of composite perovskite powder, the preparation method may include: preparing a metal oxide or a metal alkoxide; preparing a barium salt solution; mixing and reacting the metal oxide or the metal alkoxide with the barium salt solution to prepare a perovskite particle; and injecting carbon dioxide after the reaction to form a barium carbonate ($BaCO_3$) coating layer on a surface of the perovskite particle.

The metal oxide or the metal alkoxide may be an oxide or alkoxide of at least one selected from a group consisting of titanium (Ti), zirconium (Zr), and silicon (Si).

The metal oxide or the metal alkoxide may be mixed with the barium salt solution after a particle growth inhibitor is added to each of the metal oxide or the metal alkoxide and the barium salt solution.

The particle growth inhibitor may be at least one selected from a group consisting of alcohols, acids, and surfactants.

The mixing and reacting of the metal oxide or the metal alkoxide with the barium salt solution may be performed by rapid stirring or using any one of microwaves and ultrasonic waves.

The injected carbon dioxide may react with barium ions remaining on the surface of the prepared perovskite particle to form the barium carbonate coating layer on the surface of the perovskite particle.

The composite perovskite powder may have an average particle size of 1 to 10 nm.

The composite perovskite powder may have a BET specific surface area of 50 to 400 $m^2/g$.

The barium carbonate ($BaCO_3$) coating layer may have a thickness of 0.1 to 5 nm.

A molar ratio of barium carbonate ($BaCO_3$) to $ABO_3$ in the composite perovskite powder may be 0.01 to 0.5.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like elements.

Figure 1:
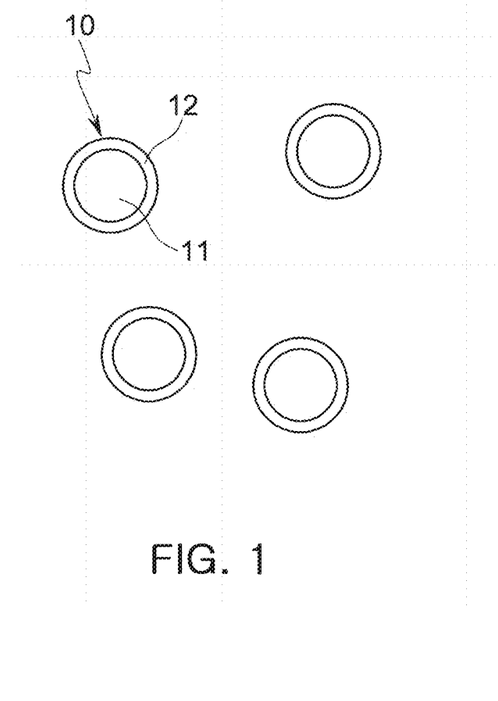
FIG. 1 is a schematic view of a composite perovskite powder according to an exemplary embodiment of the present disclosure.

FIG. 1 is a schematic view of a composite perovskite powder according to an exemplary embodiment of the present disclosure.

Referring to FIG. 1, the composite perovskite powder 10 according to the exemplary embodiment of the present disclosure may include a perovskite particle body 11 represented by $ABO_3$ and a barium carbonate ($BaCO_3$) coating layer 12 formed on a surface of the perovskite particle body.

An A site of the $ABO_3$ structure may be a single metal such as Mg, Ca, Sr, Pb, Ba, or La or a mixture thereof. Preferably, the A site may be Ba, but is not limited thereto. In addition, in the A site, Ba may be partially substituted with a rare earth metal, such that the A site may be $Ba_xY_{1-x}$, $Ba_xDy_{1-x}$, or $Ba_xHo_{1-x}$.

Further, a B site of the $ABO_3$ structure may be a metal such as Ti, Zr, or HF. Preferably, the B site may be Ti, but is not limited thereto. In addition, in the B site, Ti may be partially substituted, such that the B site may be $Ti_xZr_{1-x}$ or $Ti_xSi_{1-x}$.

The perovskite particle body 11 represented by $ABO_3$ is not particularly limited as long as it may be used as a ceramic dielectric material. For example, the perovskite particle body 11 may be barium titanate ($BaTiO_3$) and single crystalline barium titanate ($BaTiO_3$) synthesized by a hydrothermal synthesis method as described below.

An average particle size of the composite perovskite powder 10 may be 1 to 10 nm.

The ultra-fine composite perovskite powder 10 having the average particle size of 1 to 10 nm may be formed by adding a particle growth inhibitor to each of the precursors forming the A site and the B site at the time of preparing the perovskite particle body 11 represented by $ABO_3$ and mixing them.

A Brunauer-Emmett-Teller (BET) specific surface area of the composite perovskite powder 10 may be 50 to 400 $m^2/g$.

As described above, as the particles have been ultra-atomized, the specific surface area may be increased, and elution of ions in an aqueous system at the time of synthesis may be increased. Therefore, according to the exemplary embodiment of the present disclosure, elution of the ions may be prevented and aggregation may be suppressed by forming the barium carbonate ($BaCO_3$) coating layer 12 on the surface of the ultra-fine perovskite particle body 11, thereby facilitating dispersion.

The barium carbonate ($BaCO_3$) coating layer 12 may be formed at a thickness of 0.1 to 5 nm.

In the case in which the thickness of the barium carbonate ($BaCO_3$) coating layer 12 is less than 0.1 nm, an amount of ions eluted from the perovskite particle body 11 may be increased, such that in the case of barium titanate ($BaTiO_3$), a ratio of Ba to Ti may be decreased, and aggregation may become severe. In the case in which the thickness is more than 5 nm, it may be difficult to disperse the powder, and the sintering may be delayed at the time of firing.

The barium carbonate ($BaCO_3$) coating layer 12 may be uniformly formed by reacting barium ions remaining on the surface of the perovskite particle body with carbon dioxide after forming the perovskite particle body by hydrothermal synthesis.

In the composite perovskite powder 10, a molar ratio of barium carbonate ($BaCO_3$) to $ABO_3$ may be 0.01 to 0.5.

In the case in which the molar ratio of barium carbonate ($BaCO_3$) to $ABO_3$ is less than 0.01, the barium carbonate ($BaCO_3$) coating layer 12 may become non-uniform, such that ions may be eluted, and in the case of barium titanate ($BaTiO_3$), the ratio of Ba to Ti may be decreased, and aggregation may be severe. In the case in which the molar ratio is more than 0.5, the ratio of Ba to Ti may be excessively increased, such that at the time of applying the composite perovskite powder to a multilayer ceramic electronic component, capacitance may be decreased.

Further, according to the exemplary embodiment of the present disclosure, there is provided a paste composition for an internal electrode having the composite perovskite powder 10.

The paste composition for an internal electrode may contain conductive metal powder and the composite perovskite powder 10 as inhibitor powder.

The barium carbonate ($BaCO_3$) coating layer 12 may delay the sintering of the internal electrode at an initial stage of firing and be discharged into the dielectric layer to accelerate the sintering of the dielectric layer at a later stage of firing by containing the composite perovskite powder 10 as the inhibitor powder, such that a difference in sintering between the internal electrode and the dielectric layer may be decreased, thereby improving connectivity of the internal electrode and improving permittivity and reliability of the multilayer ceramic capacitor (MLCC).

The conductive metal powder may be formed of a single metal such as nickel (Ni), copper (Cu), palladium (Pd), silver (Ag), lead (Pb), platinum (Pt), and the like, or a mixture thereof, but is not limited thereto. The conductive metal powder may have an average particle size of 0.1 to 0.2 μm.

Figure 2:
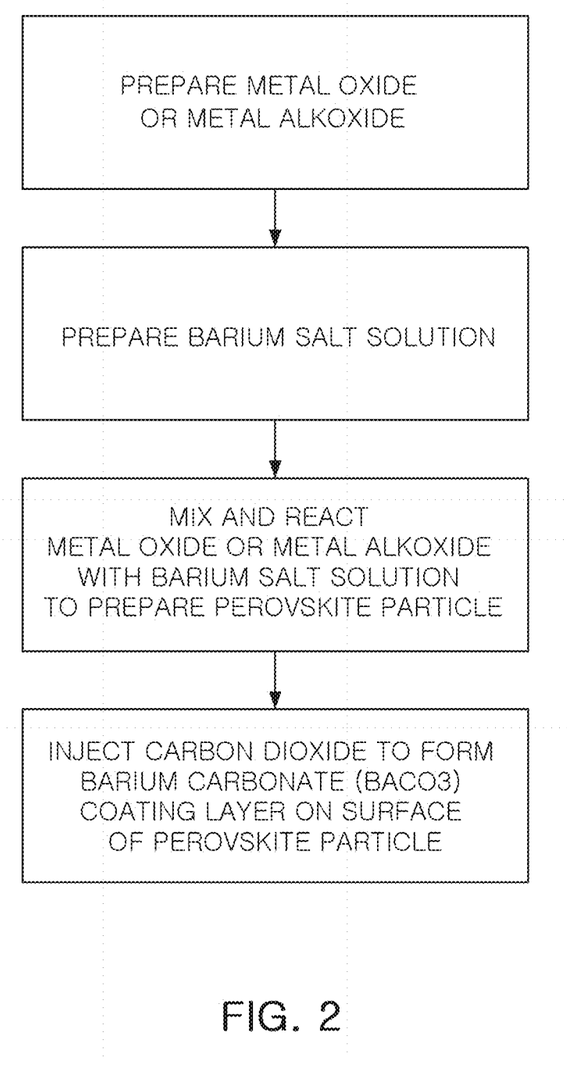
FIG. 2 is a flow chart showing a preparation method of the composite perovskite powder according to the exemplary embodiment of the present disclosure.

FIG. 2 is a flow chart showing a preparation method of the composite perovskite powder according to the exemplary embodiment of the present disclosure.

Referring to FIG. 2, in the preparation method of a composite perovskite powder according to the exemplary embodiment of the present disclosure, first, a metal oxide or a metal alkoxide may be prepared.

A metal oxide obtained by hydrolyzing a metal alkoxide or metal salt may be used, or the metal alkoxide itself may be used without hydrolysis.

The metal oxide or the metal alkoxide may be a metal oxide or a metal alkoxide containing one or a mixture of titanium (Ti), zirconium (Zr), silicon (Si), or the like.

The metal oxide may be prepared using a metal alkoxide or metal salt as a raw material.

More specifically, titanium alkoxide, zirconium alkoxide, or silicon alkoxide may be mixed with pure water, such that titanium hydrate, zirconium hydrate, or silicon hydrate may be precipitated in a gel form.

The titanium alkoxide may be one or a mixture of titanium ethoxide, titanium propoxide, titanium butoxide, or the like, the zirconium alkoxide may be one or a mixture of zirconium ethoxide, zirconium isopropoxide, zirconium butoxide, zirconium tert-butoxide, or the like, and the silicon alkoxide may be tetraethylorthosilicate.

In the case of using the metal salt, an aqueous solution may be prepared so as to have a concentration of 0.1 to 2.0M, preferably 0.5 to 1.0M by dissolving a titanium salt, a zirconium salt, or a silicon salt in water.

As the titanium salt, $TiCl_4$ or $TiOCl_2$, may be used, and as the zirconium salt, $ZrCl_4$ or $ZrOCl_2$ may be used.

Since the aqueous solution prepared as described above is mainly acidic, precipitates may be formed by adding a basic material such as ammonia, sodium hydroxide, potassium hydroxide, or the like, for hydrolysis.

The metal oxide hydrates prepared as described above may be washed, thereby removing impurities.

More specifically, the impurities present on surfaces of the particles may be removed by pressure-filtering the metal oxide hydrates to remove a residual solution and filtering the metal oxide hydrates while pouring pure water thereon.

Pure water may be added to the metal oxide hydrate powder obtained after filtering, and then stirred by a high viscosity stirrer at 0 to 60° C. for 1 to 48 hours, thereby preparing metal oxide hydrate slurry.

Acid or base may be added to the prepared slurry, wherein the acid or base may be used as a peptizer.

As an acidic peptizer, one or a mixture of hydrochloric acid, nitric acid, sulfuric acid, phosphoric acid, formic acid, acetic acid, polycarboxylic acid, and the like, may be used, and as a basic peptizer, one or a mixture of tetramethyl ammonium hydroxide, tetraethyl ammonium hydroxide, and the like, may be used, but the present disclosure is not limited thereto.

In the case of using the acidic peptizer, the pH may be adjusted at preferably 4 or less, and more preferably 2 or less, and in the case of using the basic peptizer, the pH may be adjusted at preferably 9 or more, and more preferably 12 or more.

Next, a barium salt solution may be prepared.

The barium salt may be one or a mixture of barium hydroxide, barium chloride, and barium sulfate. Preferably, the barium salt may be barium hydroxide, particularly, barium hydroxide octahydrate ($Ba(OH)_2 8H_2O$).

The rare earth element salt may be mixed with barium salt solution to thereby be dissolved therein.

The rare earth element salt is not particularly limited, but for example, a salt of yttrium (Y), dysprosium (Dy), holmium (Ho), or the like, may be used. More specifically, the rare earth element salt may be metal nitrate (yttrium nitrate, holmium nitrate, dysprosium nitrate, or the like), metal acetate, (yttrium acetate, holmium acetate, dysprosium acetate, or the like), metal hydroxide (yttrium hydroxide, holmium hydroxide, dysprosium hydroxide, or the like).

In this case, a molar ratio of the rare earth element salt to the barium salt may be 0.0001 to 0.2.

Then, the metal oxide or the metal alkoxide may be mixed and reacted with the barium salt solution, thereby obtaining perovskite particles.

In this case, in order to obtain ultra-fine perovskite particles, a particle growth inhibitor may be added to each of the metal oxide or the metal alkoxide and the barium salt solution and then mixed.

Ultra-fine perovskite particles may be obtained by adding the particle growth inhibitor each of the metal oxide or the metal alkoxide and the barium salt solution and performing a mixing reaction instead of mixing the metal oxide or the metal alkoxide with the barium salt solution to form a seed and then adding the particle growth inhibitor.

As the particle growth inhibitor, a material capable of decreasing polarity of a solvent such as alcohols including butylene glycol, dimethoxyethane, hexanediol, hexylenegly-col, methoxyethanol, and the like, a material decreasing a pH such as acids including acetic acid, nitric acid, and the like, or a material suppressing reprecipitation such as surfactants including sodium alkylsulfate, alkylbenzene sulfonate, N-acrylaminoacid salts, acrlyamide, diethanol amine, aminoxide, and the like, may be used.

At the time of mixing the metal oxide or the metal alkoxide with the barium salt solution, it is important to rapidly mix and react the metal oxide or the metal alkoxide with the barium salt solution.

As a method for mixing and reacting the metal oxide or the metal alkoxide with the barium salt solution to rapidly form the perovskite particles, a rapid stirring method, a method of using a microwave or ultrasonic waves, or the like, may be used.

A temperature may be maintained at 50 to 200° C., preferably 120 to 150° C. until nucleation of the perovskite particle is completed. Then, the temperature may be cooled to 50° C. or less.

Thereafter, a barium carbonate ($BaCO_3$) coating layer may be formed on a surface of the perovskite particle by injecting carbon dioxide after the perovskite particle formation reaction.

As the perovskite particle is formed as the ultra-fine particle, a specific surface area may be improved, such that at the time of synthesis, elution of ions in an aqueous system may be increased. Therefore, in the exemplary embodiment of the present disclosure, the barium carbonate ($BaCO_3$) coating layer may be uniformly formed on the surface of the perovskite particle by forming the ultra-fine perovskite particle and injecting carbon dioxide to thereby react carbon dioxide with barium ions remaining on the surface of the formed perovskite particle. The barium carbonate ($BaCO_3$) coating layer is formed, such that elution of ions may be prevented, and aggregation may be suppressed, thereby facilitating dispersion.

The barium carbonate ($BaCO_3$) coating layer may be formed at a thickness of 0.1 to 5 nm.

In the case in which the thickness of the barium carbonate ($BaCO_3$) coating layer is less than 0.1 nm, an amount of ions eluted from the perovskite particle may be increased, such that in the case of barium titanate ($BaTiO_3$), a ratio of Ba to Ti ratio may be decreased, and aggregation may become severe. In the case in which the thickness is more than 5 nm, it may be difficult to disperse the powder, and the sintering may be delayed at the time of firing.

The composite perovskite powder prepared as described above may have ultra-fine particles having an average particle size of 1 to 10 nm, and a BET specific surface area thereof may be 50 to 400 $m^2/g$.

In the composite perovskite powder, a molar ratio of barium carbonate ($BaCO_3$) to $ABO_3$ may be 0.01 to 0.5.

In the case in which the molar ratio of barium carbonate ($BaCO_3$) to $ABO_3$ is less than 0.01, the barium carbonate ($BaCO_3$) coating layer may become non-uniform, such that ions may be eluted, and in the case of barium titanate ($BaTiO_3$), the ratio of Ba to Ti may be decreased, and aggregation may be severe. In the case in which the molar ratio is more than 0.5, the ratio of Ba to Ti may be excessively increased, such that at the time of applying the composite perovskite powder to a multilayer ceramic electronic component, capacitance may be decreased.

Hereinafter, although the present disclosure will be described in detail through the Inventive Examples, the following Inventive Examples do not limit the scope of the present disclosure, but are provided in order to assist in understanding of the present disclosure.

Inventive Example 1

Propylene glycol was added to $TiO_2$ nanosol, and propionic acid and pure water were added to $Ba(OH)_2 8H_2O$, followed by purging with nitrogen. Then, the resultant mixture was stirred at 100° C. to thereby be dissolved. The $TiO_2$ nanosol was heated to 100° C., followed by rapid mixing and sealing. Then, the resultant mixture was stirred with $Ba(OH)_2 8H_2O$ at 100° C. to thereby react the $TiO_2$ nanosol with $Ba(OH)_2 8H_2O$. The reaction was carried out for 30 minutes, such that all titanium ions were transferred to $BaTiO_3$(BT), thereby terminating the reaction. Filtrates were partially removed from the sludge formed after termination of the reaction, and pure water was added to the sludge. An amount of ions was adjusted so that a ratio of $BaCO_3$ to BT was 0.02. Carbon dioxide ($CO_2$) gas was added into the solution while stirring, such that all of the barium ions were transferred to $BaCO_3$. The formed sludge was dried by a spray drying method. A specific surface area of the formed composite perovskite powder was 140 $m^2/g$, and an average particle size thereof was 5 nm.

Figure 3:
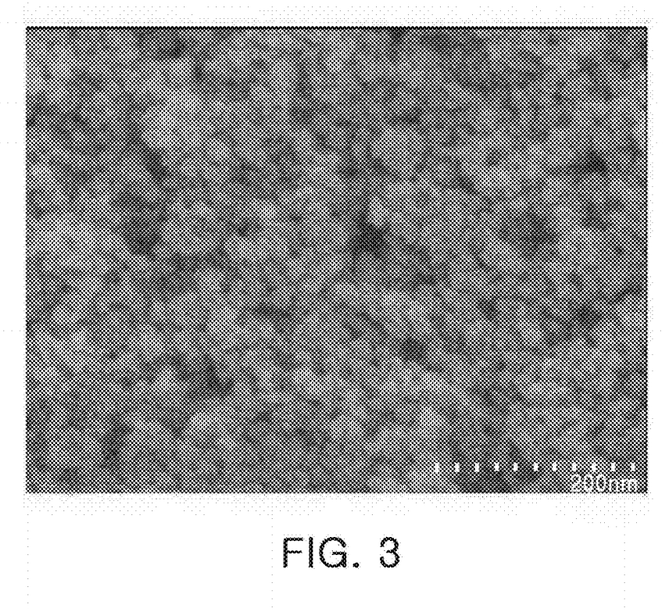
FIG. 3 is an electron microscope photograph of the composite perovskite powder prepared according to the exemplary embodiment of the present disclosure.
Figure 4:
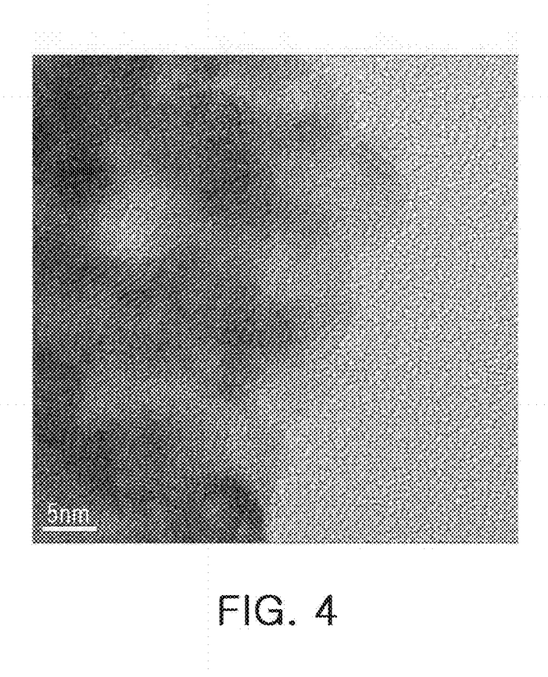
FIG. 4 is a field emission-transmission electron microscope (FE-TEM) photograph of the composite perovskite powder prepared according to the exemplary embodiment of the present disclosure.

FIG. 3 is an electron microscope photograph of the composite perovskite powder prepared in Inventive Example 1, and FIG. 4 is a field emission-transmission electron microscope (FE-TEM) photograph of the composite perovskite powder prepared in Inventive Example 1.

Inventive Example 2

Nitric acid and propylene glycol were added to titanium isopropoxide, and propionic acid and pure water were added to $Ba(OH)_2 8H_2O$, followed by purging with nitrogen. Then, the resultant mixture was stirred at 100° C. to thereby be dissolved. Titanium isopropoxide was heated to 50° C., followed by rapid mixing and sealing. Then, the resultant mixture was stirred with $Ba(OH)_2 8H_2O$ at 100° C. to thereby react titanium isopropoxide with $Ba(OH)_2 8H_2O$. The reaction was carried out for 30 minutes, such that all of the titanium ions were transferred to $BaTiO_3$ (BT), thereby terminating the reaction. Filtrates were partially removed from the sludge formed after termination of the reaction, and pure water was added to the sludge. An amount of ions was adjusted so that a ratio of $BaCO_3$ to BT was 0.02. Carbon dioxide ($CO_2$) gas was added into the solution while stirring, such that all of the barium ions were transferred to $BaCO_3$. The formed sludge was dried by a spray drying method. A specific surface area of the formed composite perovskite powder was 200 $m^2/g$, and an average particle size thereof was 3 nm.

Figure 5:
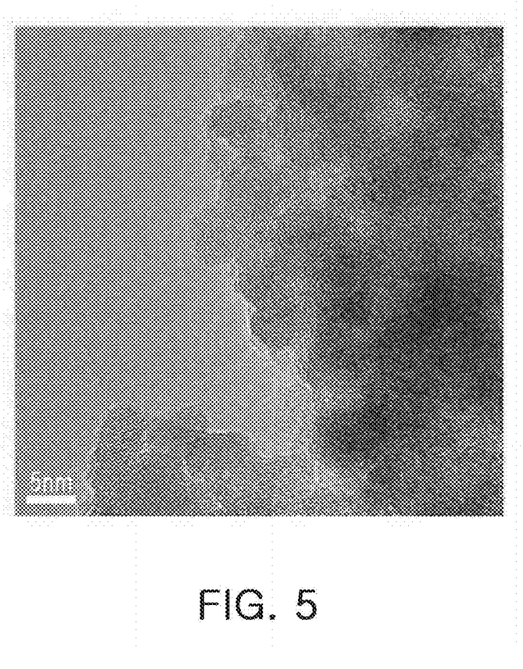
FIG. 5 is a field emission-transmission electron microscope (FE-TEM) photograph of the composite perovskite powder prepared according to another exemplary embodiment of the present disclosure.

FIG. 5 is a field emission-transmission electron microscope (FE-TEM) photograph of the composite perovskite powder prepared in Inventive Example 2.

As set forth above, according to exemplary embodiments of the present disclosure, the composite perovskite powder preventing the ions from being eluted from the aqueous system at the time of synthesis while being ultra-atomized may be provided.

In addition, at the time of using the composite perovskite powder according to the exemplary embodiment of the present disclosure as the inhibitor powder for the internal electrode, the sintering property of the internal electrode may be deteriorated, and the sintering property of the dielectric material may be increased, such that connectivity of the internal electrode may be improved, and permittivity and reliability of the multilayer ceramic capacitor (MLCC) may be increased.

While exemplary embodiments have been shown and described above, it will be apparent to those skilled in the art that modifications and variations could be made without departing from the spirit and scope of the present disclosure as defined by the appended claims.

What is claimed is:
1. A composite perovskite powder comprising:
a perovskite particle body represented by $ABO_3$; and
a barium carbonate ($BaCO_3$) coating layer formed on a surface of the perovskite particle body, wherein the composite perovskite powder is an ultra-fine composite perovskite powder having an average particle size of 1 to 10 nm, and the barium carbonate ($BaCO_3$) coating layer has a thickness of 0.1 to 5 nm, and wherein a molar ratio of barium carbonate ($BaCO_3$) to $ABO_3$ in the composite perovskite powder is 0.01 to 0.5, and wherein an A site comprises Ba, and a B site comprises Ti.

2. The composite perovskite powder of claim 1, wherein the A site is Ba, or Ba being partially substituted by at least one selected from a group consisting of Y, Dy, and Ho.

3. The composite perovskite powder of claim 1, wherein the B site is Ti, or Ti being partially substituted by at least one selected from a group consisting of Zr, and Si.

4. The composite perovskite powder of claim 1, wherein the composite perovskite powder has a Brunauer-Emmett-Teller (BET) specific surface area of 50 to 400 $m^2/g$.

5. A paste composition for an internal electrode having the composite perovskite powder of claim 1.

* * * * *